United States Patent
He et al.

(10) Patent No.: US 9,142,540 B2
(45) Date of Patent: Sep. 22, 2015

(54) ELECTROSTATIC DISCHARGE PROTECTION SEMICONDUCTOR DEVICE

(71) Applicant: UNITED MICROELECTRONICS CORP., Hsin-Chu (TW)

(72) Inventors: Yi-Ning He, Taichung (TW); Lu-An Chen, Keelung (TW); Tien-Hao Tang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/873,261

(22) Filed: Apr. 30, 2013

(65) Prior Publication Data
US 2014/0319613 A1    Oct. 30, 2014

(51) Int. Cl.
*H01L 23/552*    (2006.01)
*H01L 27/02*    (2006.01)

(52) U.S. Cl.
CPC ......... *H01L 27/0248* (2013.01); *H01L 27/0266* (2013.01)

(58) Field of Classification Search
CPC ............ H01L 27/0266; H01L 27/0255; H01L 27/0251; H01L 27/0262; H01L 27/0259
See application file for complete search history.

(56) References Cited

U.S. PATENT DOCUMENTS

| | | | | |
|---|---|---|---|---|
| 7,368,731 | B2 * | 5/2008 | Sullivan | 250/492.1 |
| 7,368,761 | B1 * | 5/2008 | Lai et al. | 257/173 |
| 2005/0029540 | A1 * | 2/2005 | Kodama et al. | 257/173 |
| 2008/0293202 | A1 * | 11/2008 | Shiraki et al. | 438/270 |
| 2009/0008710 | A1 * | 1/2009 | Wei et al. | 257/337 |
| 2009/0261428 | A1 * | 10/2009 | Chao et al. | 257/409 |
| 2009/0283832 | A1 * | 11/2009 | Sugiura | 257/355 |
| 2010/0109043 | A1 * | 5/2010 | Wang et al. | 257/133 |
| 2013/0149831 | A1 * | 6/2013 | Lin et al. | 438/342 |

OTHER PUBLICATIONS

Chen et al., Title: Method of Manufacturing NMOS Transistor With Low Trigger Voltage, pending U.S. Appl. No. 13/271,239, filed Oct. 12, 2011.

\* cited by examiner

*Primary Examiner* — Hoai V Pham
*Assistant Examiner* — Long Le
(74) *Attorney, Agent, or Firm* — Winston Hsu; Scott Margo

(57) ABSTRACT

A semiconductor device includes a substrate, a gate positioned on the substrate, a drain and a source formed in the substrate at respective two sides of the gate, and a doped region formed in the source. The drain and the source comprise a first conductivity type and the doped region comprises a second conductivity type. The first conductivity type and the second conductivity type are complementary to each other.

15 Claims, 9 Drawing Sheets

ELECTROSTATIC DISCHARGE PROTECTION SEMICONDUCTOR DEVICE

BACKGROUND OF THE INVENTION

1. Field of the Invention

The invention relates to a semiconductor device, and more particularly, to an electrostatic discharge (hereinafter abbreviated as ESD) protection semiconductor device.

2. Description of the Prior Art

Chips and/or Integrated circuits (ICs) are the most essential hardware foundation of the modern information society. As products based on ICs become more delicate, they also become more vulnerable to the impacts of the external environment. For example, it is found that ESD is a constant threat to modern electronics. The result of ESD on unprotected ICs is often destruction, characterized by melting or explosion of a part of the ICs. Therefore, the ESD protection devices are taken as important components of the protection circuitry provided in today's electronic devices.

Various approaches have been made to provide an ESD protection device associated with IC interface pads to prevent a core circuit of the ICs from the ESD damages. Typically, during a normal IC operation, the ESD protection device is turned off. However when an ESD event occurs, the ESD surges will cause the ESD protection device to breakdown and create a substrate current path, through which the ESD current is diverted to ground and thus the core circuit is protected. Therefore, it is conceivable that if the ESD protection device can be quickly triggered, it will be better to bypass the ESD current from the core circuit.

There is therefore a continuing need in the semiconductor processing art to develop an ESD protection device having lower trigger voltage which can be quickly turned on in order to render immediate protection to the core circuit. Furthermore, it is been found that the trigger voltage of the ESD protection device is related to the substrate resistance (hereinafter abbreviated as $R_{sub}$): Small $R_{sub}$ leads to a higher trigger voltage which is undesirable to the ESD protection device. In view of the above, there exists a need for an ESD protection device having increased $R_{sub}$ that results in reduced trigger voltage.

SUMMARY OF THE INVENTION

According to the claimed invention, an ESD protection semiconductor device is provided. The ESD protecting semiconductor device includes a substrate, a gate positioned on the substrate, a drain and a source formed in the substrate at respective two sides of the gate, and a first doped region formed at one end of the source. The drain and the source comprise a first conductivity type, and the first doped region comprises a second conductivity type. The first conductivity type and the second conductivity type are complementary to each other.

According to the claimed invention, another semiconductor device is provided. The semiconductor device includes a substrate, a gate positioned on the substrate, a drain and a source formed in the substrate at respective two sides of the gate, and a doped region formed in the source. The drain and the source comprise a first conductivity type, and the doped region comprises a second conductivity type. The first conductivity type and the second conductivity type are complementary to each other.

According to the ESD protection semiconductor devices provided by the present invention, at least one doped region having the second conductivity complementary to the source is disposed in the source and/or at one end of the source. It is found that $R_{sub}$ is conspicuously increased by forming the doped region and thus the trigger voltage of the ESD protection semiconductor device is desirably reduced. Consequently, the ESD protection semiconductor device can be quickly turned on for rendering immediate ESD protection to the core circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
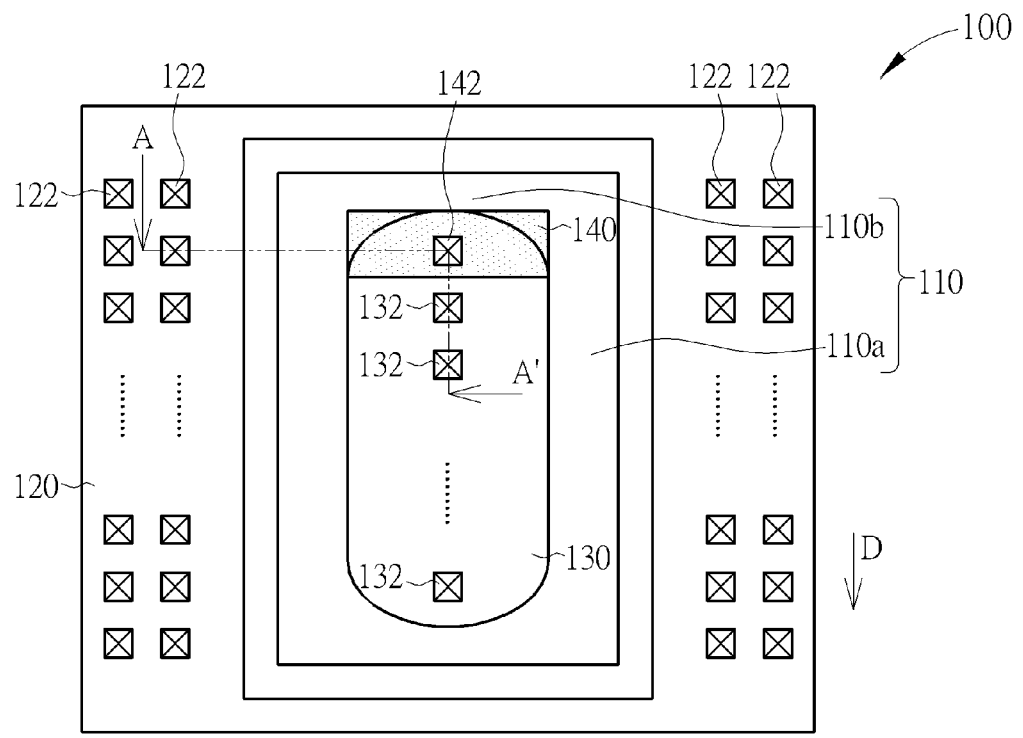
FIG. 1 is a schematic drawing illustrating an ESD protection semiconductor device provided by a first preferred embodiment of the present invention.
Figure 2:
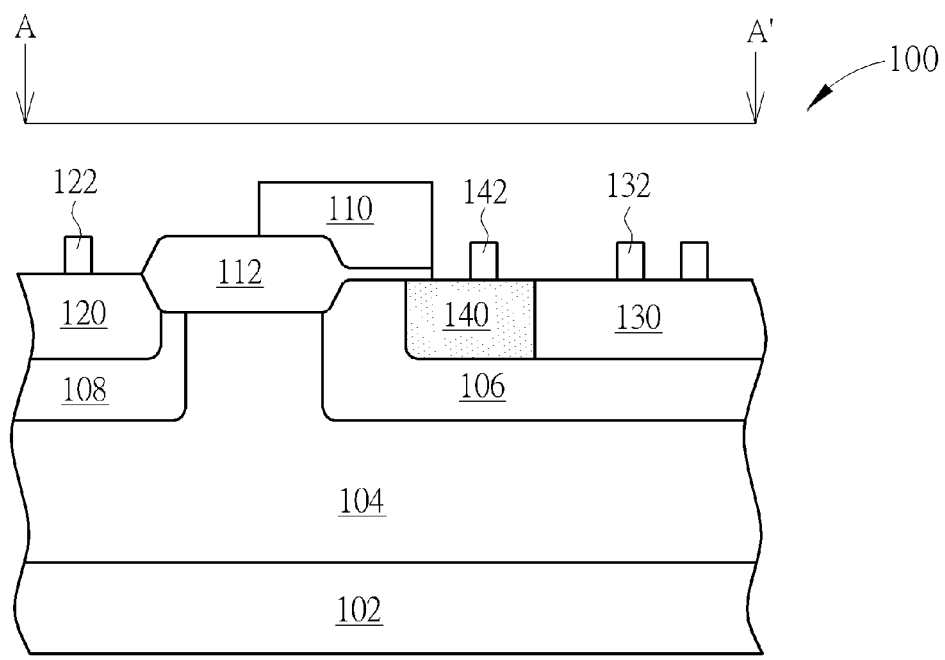
FIG. 2 is a cross-sectional view taken along Line A-A' of FIG. 1.

Please refer to FIGS. 1-2, wherein FIG. 1 is a schematic drawing illustrating an ESD protection semiconductor device provided by a first preferred embodiment of the present invention, and FIG. 2 is a cross-sectional view take along Line A-A' of FIG. 1. As shown in FIGS. 1 and 2, an ESD protection semiconductor device 100 provided by the preferred embodiment includes a substrate 102 having a deep well region 104 formed therein. In the preferred embodiment, the deep well region 104 includes a first conductive type and the substrate 102 includes a second conductive type. The first conductivity type and the second conductivity type are complementary to each other and therefore the first conductive type is n type while the second conductive type is p type according to the preferred embodiment. Accordingly, the ESD protection semiconductor device 100 provided by the preferred embodiment is an n-typed semiconductor device 100 positioned on the n-typed deep well region 104 in the p-typed semiconductor substrate 102.

Please still refer to FIGS. 1-2. The ESD protection semiconductor device 100 provided by the preferred embodiment includes a gate 110 and an isolation structure 112 such as a field oxide (FOX) layer and a gate dielectric layer formed on the deep well region 104, and the gate 110 covers a portion of the isolation structure 112. The gate 110 has a layout pattern of a racetrack shape. In other words, the gate 110 provided by the preferred embodiment is also known as a racetrack type gate approach. As shown in FIG. 1, the gate 110 includes a pair of liner portions 110a that parallel with each other and a pair of curved end portions 110b that respectively positioned at two ends of the liner portions 110a. In detail, the gate 110 of the preferred embodiment has rectangular and hollow layout pattern. As shown in FIG. 1, an outer perimeter of the gate 110 includes a rectangular outer perimeter while the inner perimeter of the gate 110 includes a pair of liner inner perimeters that parallel with each other and a pair of curved inner perimeters that respectively positioned at two ends of the liner inner perimeter. Accordingly, the liner inner perimeters and the curved inner perimeters construct a racetrack perimeter.

Please still refer to FIGS. 1-2. The ESD protection semiconductor device 100 further includes a body region 106 and a drift region 108, which are spaced apart from each other by the gate 110 and the isolation structure 112 as shown in FIG. 2. The drift region 108 includes the first conductivity type and the body region 106 includes the second conductivity type. In other words, the semiconductor device 110 includes a p-typed body region 106 and an n-typed drift region 108. The semiconductor device 100 further includes a drain 120 and a common source 130 formed in the deep well region 104 in the substrate 102. More particularly, the drain 120 is formed in the drift region 108 while the common source 130 is formed in the body region 106. The common source 130 and the drain 120 both include the first conductivity type and thus are n-typed drain 120 and the n-typed common source 130. As shown in FIG. 1, drain 120 surrounds the gate 110 while the common source 130 is enclosed by the racetrack-shaped gate 110. Furthermore, the common source 130 enclosed by the gate 110 is formed to extend along a direction D as shown in FIG. 1. More important, the ESD protection semiconductor device 100 provided by the preferred embodiment includes one doped region 140 formed in the body region 106 in the deep well region 104 in the substrate 102. As shown in FIG. 1, the doped region 140 is formed at one end of the common source 130 and a portion of the doped region 140 is covered by the gate 110, particularly covered by the curved end portion 110b of the gate 110. As shown in FIGS. 1 and 2, the doped region 140 and the common source 130 together are spaced apart from the drain 120 by the gate 110 and the isolation structure 112. The doped region 140 includes the second conductivity type and thus is a p-typed doped region which is complementary to the n-typed drain 120 and the n-typed common source 130.

Please still refer to FIGS. 1-2. The ESD protection semiconductor device 100 provided by the preferred embodiment further includes one first contact 142, a plurality of second contacts 132, and a plurality of third contacts 122 formed on the substrate 102. Additionally, the amount of the first contact 142 can be larger than 1 if required. More specifically, the first contact 142 is electrically connected to the doped region 140, the second contacts 132 are electrically connected to the common source 130, and the third contacts 122 are electrically connected to the drain 120. The first contact 142 makes it accessible to provide a voltage to the body region 106. The second contacts 132 are arranged along the direction D in the common source 130 as shown in FIG. 1. It is noteworthy that due to the longitudinal arrangement, the spaces between the first contact 142 and each second contact 132 are gradually increased along the direction D. More important, as the spaces between the first contact 142 and the second contacts 132 are increased, $R_{sub}$ is increased, thereby reducing the trigger voltage of the semiconductor device 100.

According to the ESD protection semiconductor device 100 provided by the first preferred embodiment, the doped region 140 is provided at only one end of the common source 130 and thus the spaces between the first contact 142 which is formed in the doped region 140 and the second contacts 132 which are formed in the common source 130 are increased and resulted in increased $R_{sub}$. Consequently, the trigger voltage of the ESD protection semiconductor device 100 is reduced without impacting other specification such as the breakdown voltage of the ESD protection semiconductor device 100. Additionally, the doped region 140 can further avoid the channel generated in the curved end portion 110b of the gate 110, and thus the electric fields generated near the curved end portion 110b is avoided.

Figure 3:
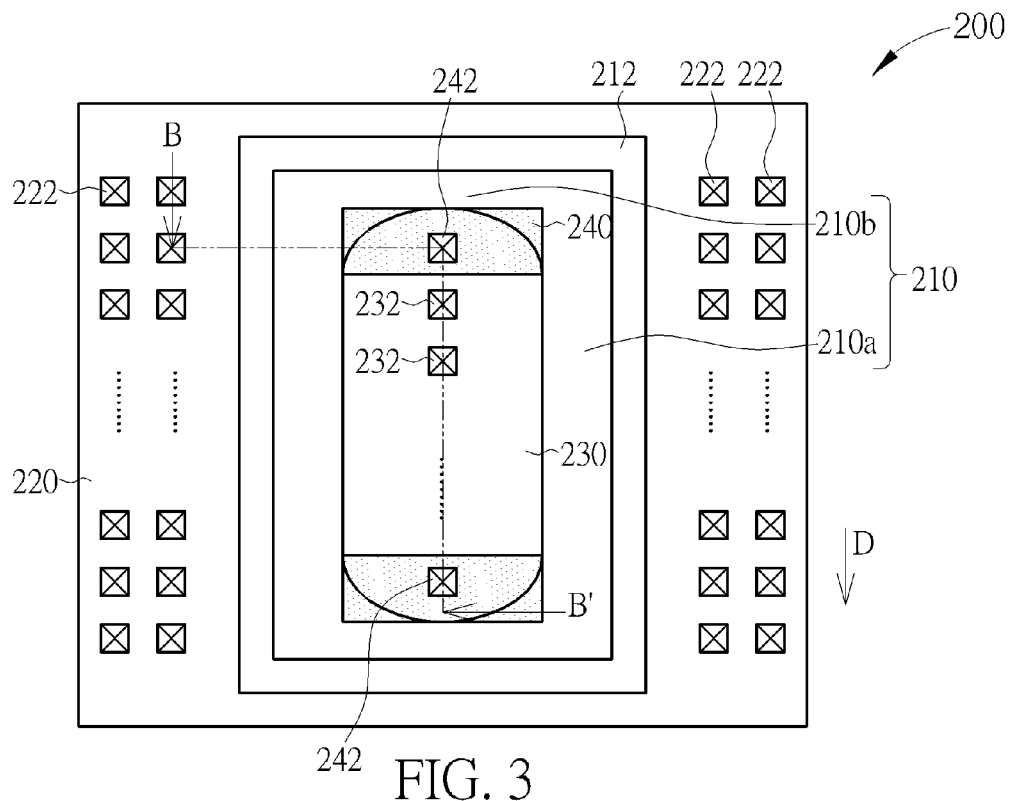
FIG. 3 is a schematic drawing illustrating an ESD protection semiconductor device provided by a second preferred embodiment of the present invention.
Figure 4:
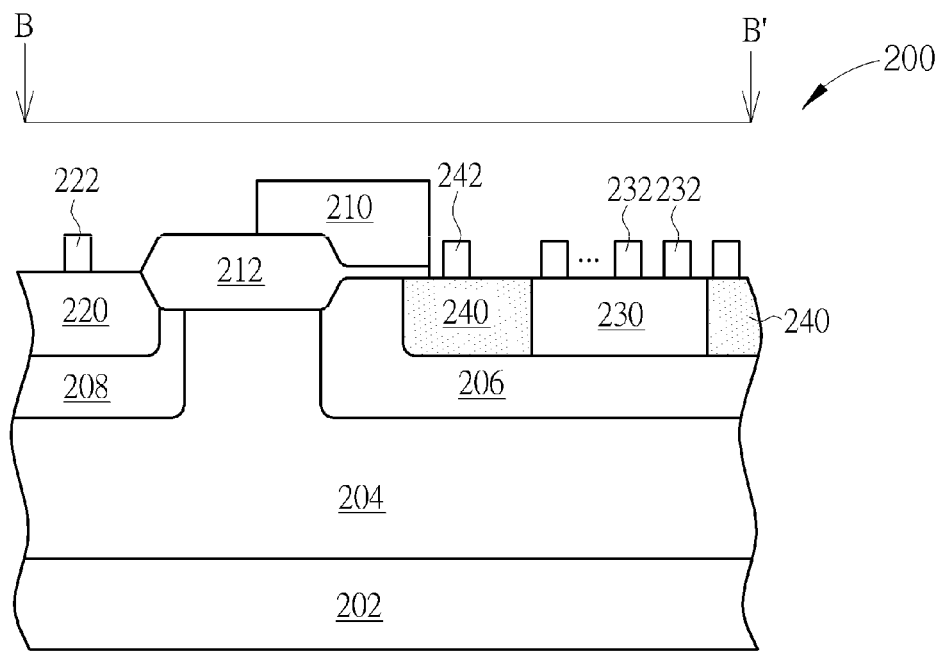
FIG. 4 is a cross-sectional view taken along Line B-B' of FIG. 3.

Please refer to FIGS. 3-4, wherein FIG. 3 is a schematic drawing illustrating an ESD protection semiconductor device provided by a second preferred embodiment of the present invention and FIG. 4 is a cross-sectional view take along Line B-B' of FIG. 3. It should be noted that elements the same in both first and second preferred embodiments include the same conductivity type, and thus those details are omitted herein in the interest of brevity. As shown in FIGS. 3 and 4, an ESD protection semiconductor device 200 provided by the preferred embodiment includes a p-typed substrate 202 having an n-typed deep well region 204 formed therein.

Please still refer to FIGS. 3-4. The ESD protection semiconductor device 200 provided by the preferred embodiment includes a gate 210 and an isolation structure 212 formed on the deep well region 204, and the gate 210 covers a portion of the isolation structure 212. The gate 210 has a layout pattern of a racetrack shape. As shown in FIG. 3, the gate 210 includes a pair of liner portions 210a that parallel with each other and a pair of curved end portions 210b that respectively positioned at two ends of the liner portions 210a.

Please still refer to FIGS. 3-4. The ESD protection semiconductor device 200 further includes a p-typed body region 206 and an n-typed drift region 208, which are spaced apart from each other by the gate 210 and the isolation structure 212 as shown in FIG. 3. The ESD protection semiconductor device 200 further includes an n-typed drain 220 and an n-typed common source 230 formed in the deep well region 204 in the substrate 202. More particularly, the drain 220 is formed in the drift region 208 while the common source 230 is formed in the body region 206. As shown in FIG. 3, the drain 220 surrounds the gate 210 while the common source 230 is enclosed by the racetrack-shaped gate 210. Furthermore, the common source 230 enclosed by the gate 210 extends along a direction D as shown in FIG. 3. More important, the ESD protection semiconductor device 200 provided by the preferred embodiment includes a pair of p-typed doped regions 240 formed in the deep well region 204 in the substrate 202. As shown in FIG. 3, the pair of doped regions 240 are formed at respective two ends of the common source 230 and a portion of each doped region 240 is covered by the gate 210, particularly covered by the curved end portions 210b of the gate 210. As shown in FIGS. 3 and 4, the doped regions 240 and the common source 230 together are spaced apart from the drain 220 by the gate 210 and the isolation structure 212.

Please still refer to FIGS. 3-4. The ESD protection semiconductor device 200 provided by the preferred embodiment further includes at least one first contact 242, a plurality of second contacts 232, and a plurality of third contacts 222 formed on the substrate 202. For example, there is a pair of first contacts 242 respectively electrically connected to the doped regions 240. However, the amounts of the first contact 242 in each of the doped regions 240 can be larger than 1 if required. As mentioned above, the second contacts 232 are electrically connected to the common source 230, and the third contacts 222 are electrically connected to the drain 220. The first contacts 242 make it accessible to provide a voltage to the body region 206. The second contacts 232 are arranged along the direction D in the common source 230 as shown in FIG. 3. It is noteworthy that due to the longitudinal arrangement, the spaces between the first contact 242 near two ends of the common source 230 and the second contacts 232 disposed in the common source 230 are gradually increased along a direction toward the center of the common source 230. More important, as the spaces between the first contacts 242 and the second contacts 232 are increased, $R_{sub}$ is increased, thereby reducing the trigger voltage of the ESD protection semiconductor device 200.

According to the ESD protection semiconductor device 200 provided by the second preferred embodiment, the doped region 240 is provided at two ends of the common source 230 and thus the spaces between the first contacts 242 which are formed in the doped regions 240 and the second contacts 232 which are formed in the common source 230 are increased and resulted in increased $R_{sub}$. Consequently, the trigger voltage of the ESD protection semiconductor device 200 is reduced without impacting other specification such as the breakdown voltage of the ESD protection semiconductor device 200.

Additionally, in a modification to the second preferred embodiment, only one first contact 242 is provided to be electrically connected one of the doped regions 240. In the instant modification, the spaces between the first contact 242 and the second contacts 232 are still increased and thus $R_{sub}$ is increased and resulted in reduced trigger voltage for the semiconductor device 200. Furthermore, for the other doped region 240 has no first contact 242 formed therein, it still avoids the channel generated in the curved end portion 210b of the gate 210, and thus the electric fields generated near the curved end portion 210b is avoided.

Figure 5:
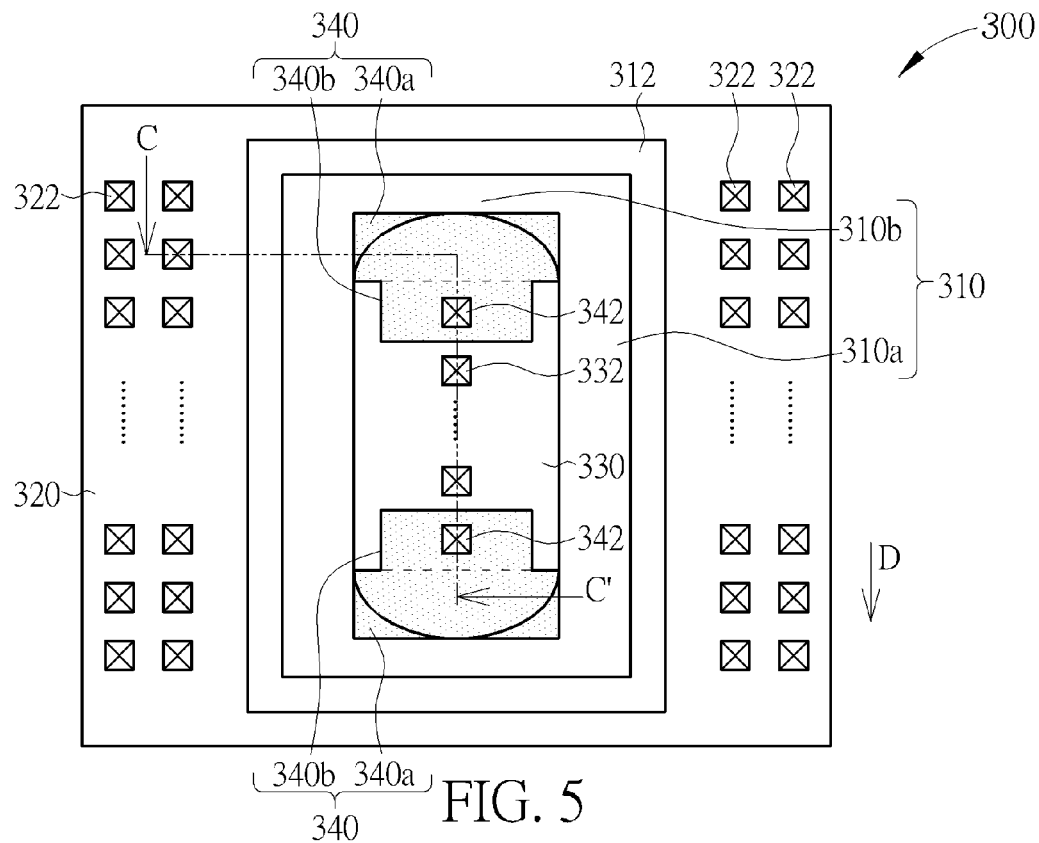
FIG. 5 is a schematic drawing illustrating an ESD protection semiconductor device provided by a third preferred embodiment of the present invention.
Figure 6:
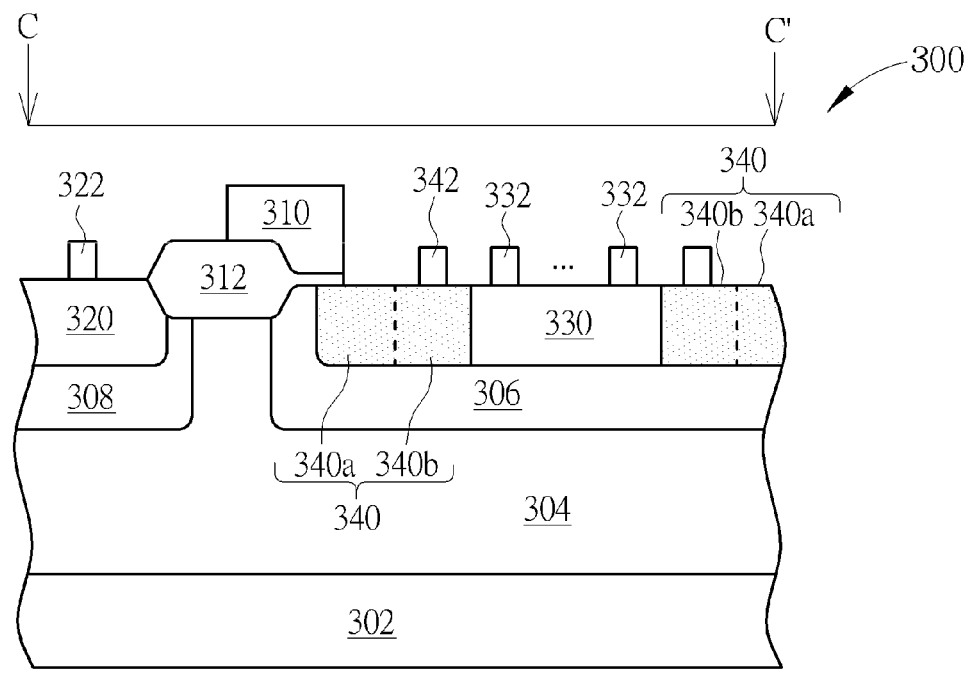
FIG. 6 is a cross-sectional view taken along Line C-C' of FIG. 5.

Please refer to FIGS. 5-6, wherein FIG. 5 is an ESD protection schematic drawing illustrating a semiconductor device provided by a third preferred embodiment of the present invention and FIG. 6 is a cross-sectional view take along Line C-C' of FIG. 5. It should be noted that elements the same in the first, second, and third preferred embodiments include the same conductivity type, and thus those details are omitted herein in the interest of brevity. As shown in FIGS. 5 and 6, an ESD protection semiconductor device 300 provided by the preferred embodiment includes a p-typed substrate 302 having an n-typed deep well region 304 formed therein. The ESD protection semiconductor device 300 includes a gate 310 and an isolation structure 312 formed on the deep well region 304, and the gate 310 covers a portion of the isolation structure 312. The gate 310 has a layout pattern of a racetrack shape. As shown in FIG. 5, the gate 310 includes a pair of liner portions 310a that parallel with each other and a pair of curved end portions 310b that respectively positioned at two ends of the liner portions 310a.

Please still refer to FIGS. 5-6. The ESD protection semiconductor device 300 further includes a p-typed body region 306 and an n-typed drift region 308, which are spaced apart from each other by the gate 310 and the isolation structure 312 as shown in FIG. 6. The ESD protection semiconductor device 300 further includes an n-typed drain 320 formed in the drift region 308 and an n-typed common source 330 formed in the body region 306. As shown in FIG. 5, the drain 320 surrounds the gate while the common source 330 is enclosed by the racetrack-shaped gate 310. Furthermore, the common source 330 enclosed by the gate 310 extends a long a direction D as shown in FIG. 5. More important, the semiconductor device 300 provided by the preferred embodiment includes a pair of p-typed doped regions 340 formed in the body region 306 in the deep well region 304 in the substrate 302. As shown in FIGS. 5 and 6, the doped regions 340 and the common source 330 together are spaced apart from the drain 320 by the gate 310 and the isolation structure 312. As shown in FIG. 5, the pair of doped regions 340 are formed at respective two ends of the common source 330. More important, each of the doped regions 340 includes a pyramid shape. In detail, each of the doped regions includes a first level 340a and a second level 340b. The first levels 340a of the doped regions 340 are formed at respective two ends of the common source 340 and a portion of the first levels 340a are covered by the gate 310, particularly covered by the curved end portions 310b of the gate 310. As shown in FIG. 5, the second level 340b is formed between a center of the common source 330 and the first level 340a. A width of the second level 340b is smaller than a width of the first level 340a and thus the doped region 340 obtains the pyramid shape.

Please still refer to FIGS. 5-6. The ESD protection semiconductor device 300 provided by the preferred embodiment further includes at least one first contact 342, a plurality of second contacts 332, and a plurality of third contacts 322 formed on the substrate 302. For example, there is a pair of first contacts 342 respectively electrically connected to the second levels 340b of the doped regions 340. However, the amounts of the first contact 342 in each second level 340b of the doped regions 340 can be larger than 1 if required. As mentioned above, the second contacts 332 are electrically connected to the common source 330, and the third contacts 322 are electrically connected to the drain 320. The first contacts 342 make it accessible to provide a voltage to the body region 306. The second contacts 332 are arranged along the direction D in the common source 330 as shown in FIG. 5. It is noteworthy that due to the longitudinal arrangement, the spaces between the first contact 342 in the second level 340b and the second contacts 332 disposed in the common source 330 are gradually increased along a direction toward the center of the common source 330. More important, as the spaces between the first contact 342 and the second contacts 332 are increased, $R_{sub}$ is increased, thereby reducing the trigger voltage of the semiconductor device 300.

According to the ESD protection semiconductor device 300 provided by the third preferred embodiment, the doped regions 340 are provided at two ends of the common source 330 and thus the spaces between the first contacts 342 which are formed in the second level 340b of the doped regions 340 and the second contacts 332 which are formed in the common source 330 are increased and resulted in increased $R_{sub}$. Consequently, the trigger voltage of the ESD protection semiconductor device 300 is reduced without impacting other specification such as the breakdown voltage of the ESD protection semiconductor device 300. Furthermore, the first level 340a of the doped region 340 is provided without any first contact 342 formed therein according to the third preferred embodiment, therefore, the first level 340a of the doped region 340 avoids the channel generated in the curved end portion 310b of the gate 310, and thus the electric fields generated near the curved end portion 310b is avoided.

Figure 7:
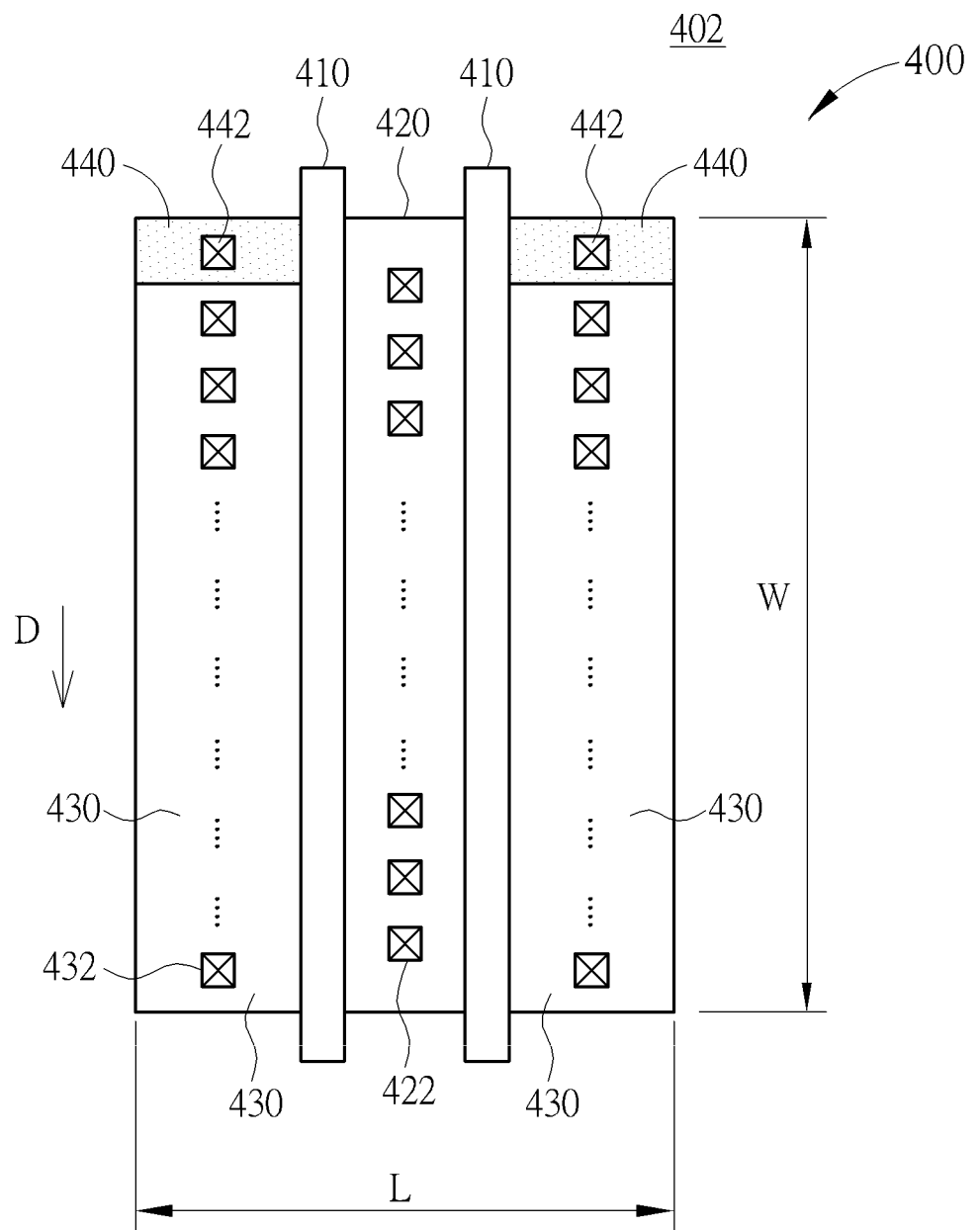
FIG. 7 is a schematic drawing illustrating an ESD protection semiconductor device provided by a fourth preferred embodiment of the present invention.

Please refer to FIG. 7, which is a schematic drawing illustrating an ESD protection semiconductor device provided by a fourth preferred embodiment of the present invention. It should be noted that elements the same in the aforementioned embodiments and the fourth preferred embodiment include the same conductivity type, and thus those details are omitted herein in the interest of brevity. As shown in FIG. 7, an ESD protection semiconductor device 400 provided by the preferred embodiment includes a p-typed substrate 402 having an n-typed deep well region (not shown) formed therein.

Please still refer to FIG. 7. The ESD protection semiconductor device 400 provided by the preferred embodiment includes a gate 410, an isolation structure (not shown) such as a FOX layer and a gate dielectric layer (not shown) formed on the deep well region, and the gate 410 covers a portion of the isolation structure. In this preferred embodiment, the gate 410 has a layout pattern of a stripe shape. In other words, the gate 410 provided by the preferred embodiment is also known as a finger type gate approach. The semiconductor device 400 further includes a p-typed body region (not shown) and an n-typed drift region (not shown), which are spaced apart from each other by the gate 410 and the isolation structure. The ESD protection semiconductor device 400 further includes a common drain 420 and a source 430 formed in the deep well region in the substrate 402. More important, the ESD protection semiconductor device 400 provided by the preferred embodiment includes one p-doped region 440 formed at one end of the source 430. It is noteworthy that for clarifying the spatial relationships between the gate 410, the common drain 420, the source 430, and the p-doped region 440, only abovementioned elements are shown in FIG. 7 while other elements such as the body region, the drift region, the deep well region, and the insulating structure are all omitted. However, those skilled in the art would easily realize the placements for the omitted elements according to the aforementioned first preferred embodiment. As shown in FIG. 7, the doped region 440 and the source 430 together are spaced apart from the common drain 420 by the gate 410 and the isolation structure.

Additionally, a width W of the ESD protection semiconductor device 400, which is defined as an overall length of the source region 430 and the p-doped region 440, is between 18-30 μm. And a length L of the ESD protection semiconductor device 400, which is defined as an overall width of the sources 440, the gates 410, and the common drain 420, is between 75-95 μm. For example but not limited to this, the width W of the ESD protection semiconductor device 400 is 19.7 μm while the length L is 75 μm.

Please still refer to FIG. 7. The ESD protection semiconductor device 400 provided by the preferred embodiment further includes one first contact 442 formed in the p-doped region 440, a plurality of second contacts 432 formed in the source 430, and a plurality of third contacts 422 formed in the common drain 420. However, as mentioned above, the amounts of the first contact 442 can be larger than 1 if required. More specifically, the first contact 442 is electrically connected to the doped region 440, the second contacts 432 are electrically connected to the source 430, and the third contacts 422 are electrically connected to the common drain 420. The first contact 442 makes it accessible to provide a voltage to the body region through the p-doped region 440. The second contacts 432 are arranged along the direction D in the common source 430 as shown in FIG. 7. It is noteworthy that due to the longitudinal arrangement, the spaces between the first contact 442 and each second contact 432 are gradually increased along the direction D. More important, as the spaces between the first contact 442 and the second contacts 432 are increased, $R_{sub}$ is increased, thereby reducing the trigger voltage of the semiconductor device 400.

According to the ESD protection semiconductor device 400 provided by the fourth preferred embodiment, the doped region 440 is provided at only one end of the source 430 and thus the spaces between the first contact 442 which is formed in the doped region 440 and the second contacts 432 which are formed in the common source 430 are increased and resulted in increased $R_{sub}$. Consequently, the trigger voltage of the ESD protection semiconductor device 400 is reduced without impacting other specification such as the breakdown voltage of the ESD protection semiconductor device 400.

Figure 8:
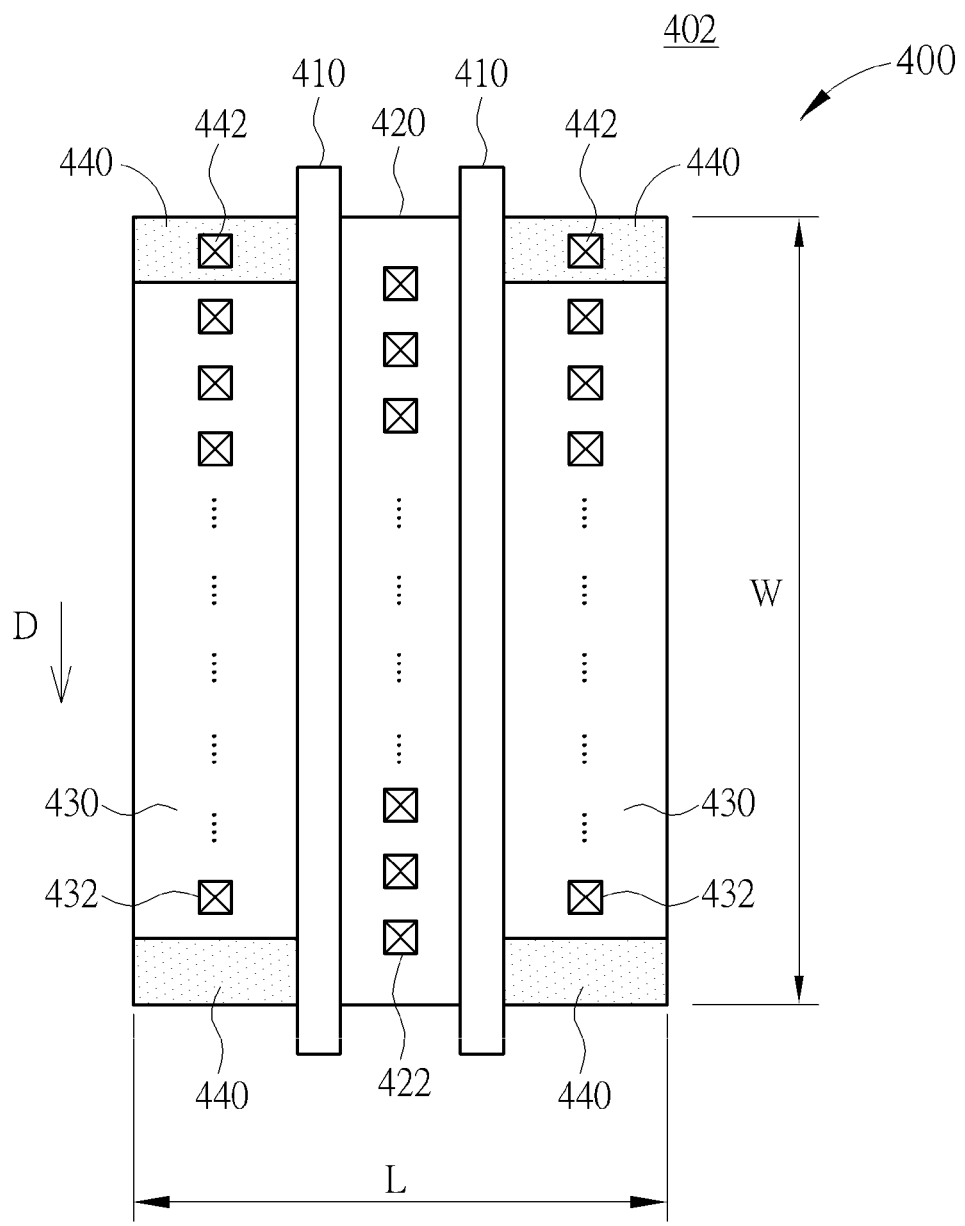
FIG. 8 is a schematic drawing illustrating an ESD protection semiconductor device provided by a fifth preferred embodiment of the present invention.

Please refer to FIG. 8, which is a schematic drawing illustrating an ESD protection semiconductor device provided by a fifth preferred embodiment of the present invention. It should be noted that elements the same in the aforementioned embodiments and the fifth preferred embodiment include the same conductivity type, and thus those details are omitted herein in the interest of brevity. Furthermore, elements the same in the fourth and fifth preferred embodiments are designated by the same numerals. The difference between the fourth preferred embodiment and the fifth preferred embodiment is: only one p-doped region 440 is provided by the fourth preferred embodiment while a pair of p-doped regions is provided by the fifth preferred embodiment.

Please still refer to FIG. 8. It should be noted that the pair of the p-doped regions 440 are formed at respective two ends of the source 430. As shown in FIG. 8, the doped regions 440 and the source 430 together are spaced apart from the common drain 420 by the gate 410 and the isolation structure. Furthermore, the pair of p-doped regions 440 can include a pyramid shape as mentioned in the third preferred embodiment. As mentioned above, a width W of the ESD protection semiconductor device 400, which is defined as an overall length of the source region 430 and the p-doped region 440, is between 18-30 μm. And a length L of the ESD protection semiconductor device 400, which is defined as an overall width of the sources 430, the gates 410, and the common drain 420, is between 75-95 μm.

Please still refer to FIG. 8. It is also noteworthy that the ESD protection semiconductor device 400 provided by the preferred embodiment further includes only one first contact 442 formed in one of the p-doped regions 440, a plurality of second contacts 432 formed in the source 430, and a plurality of third contacts 422 formed in the common drain 420. More important, for the other doped region 442, there has no first contact 442 formed in, The first contact 442 is electrically connected to one of the doped regions 440, the second contacts 432 are electrically connected to the source 430, and the third contacts 422 are electrically connected to the common drain 420. The first contact 442 makes it accessible to provide a voltage to the body region through the p-doped region 440. The second contacts 432 are arranged along the direction D in the common source 430 as shown in FIG. 8. It is noteworthy that due to the longitudinal arrangement, the spaces between the first contact 442 and each second contact 432 are gradually increased along the direction D. More important, as the spaces between the first contact 442 and the second contacts 432 are increased, $R_{sub}$ is increased, thereby reducing the trigger voltage of the ESD protection semiconductor device 400.

Figure 9:
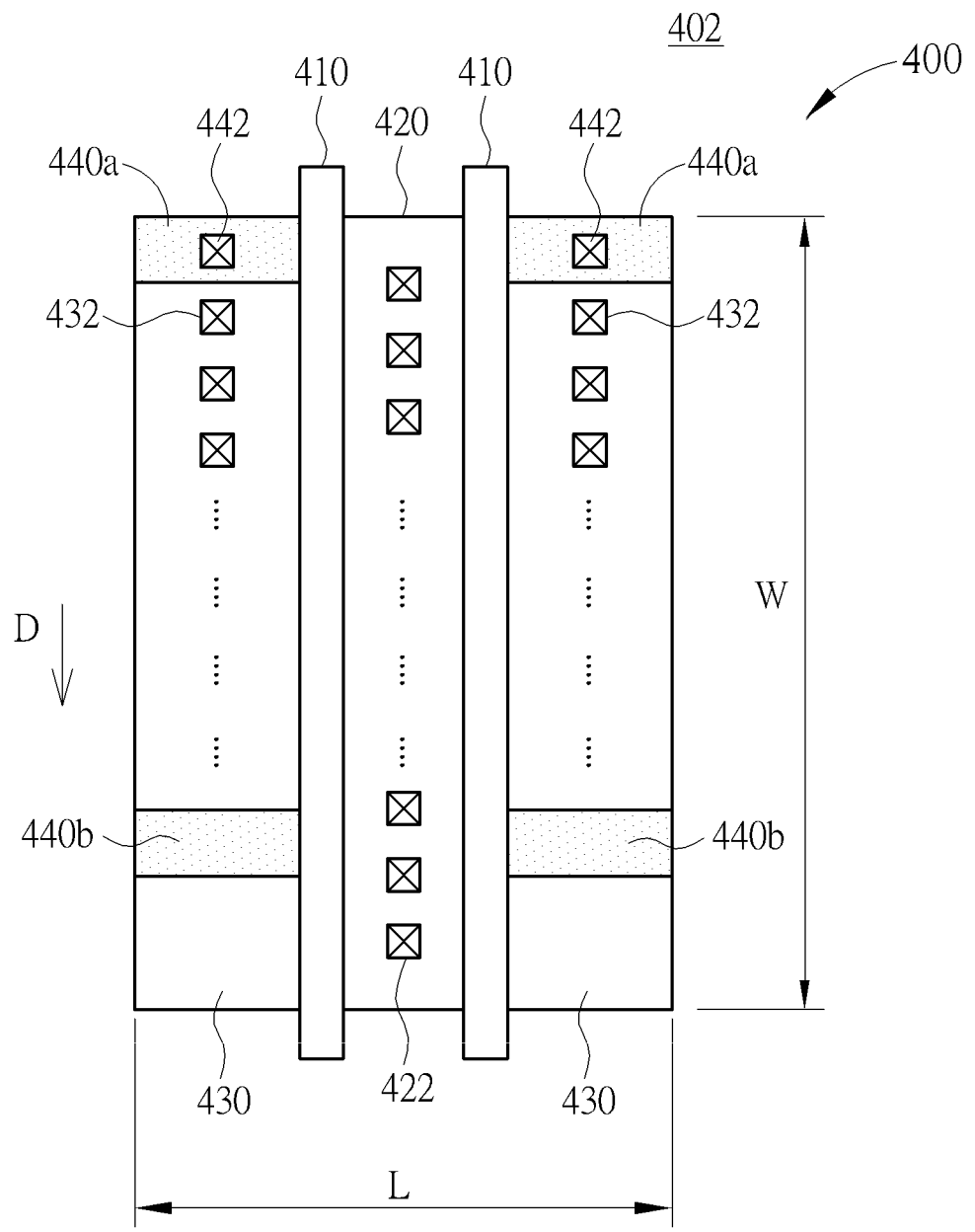
FIG. 9 is a schematic drawing illustrating an ESD protection semiconductor device provided by a modification to the fifth preferred embodiment.

Please refer to FIG. 9, which is a modification to the fifth preferred embodiment of the present invention. It should be noted that elements the same in the fifth embodiment and the modification include the same conductivity type, and thus those details are omitted herein in the interest of brevity.

Furthermore, elements the same in the fifth preferred embodiment and the modification are designated by the same numerals. The difference between the fifth preferred embodiment and the modification embodiment is: the pair of p-doped region 440 are fixed at respective two ends of the source 430 according to the fifth preferred embodiment while only one of the p-doped regions 440a is fixed on one end of the source 430 according to the modification. It should be noted that the other p-doped region 440b is formed to interrupt the source 430 as shown in FIG. 9. In other words, the other p-doped region 440b is not formed at the end of the source 430, but sandwiched in the source 430 in the substrate-horizontal direction as shown in FIG. 9.

Please still refer to FIG. 9. It is also noteworthy that the ESD protection semiconductor device 400 provided by the modification includes only one first contact 442 formed in the p-doped region 440a that is fixed at the end of the source 430. In other words, the other p-doped region 440b, which is not formed at the end of the source 430 possesses no contact formed therein.

Figure 10:
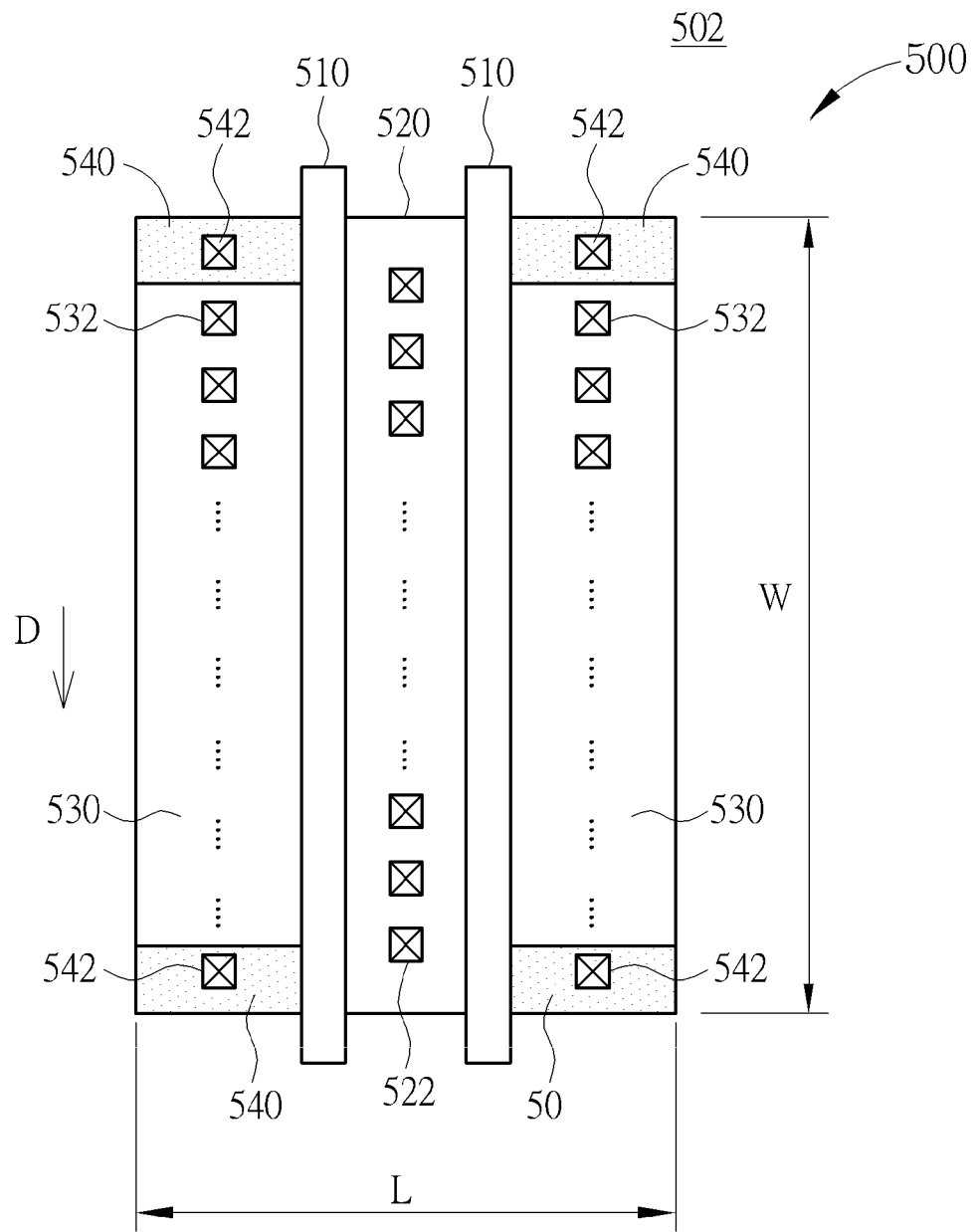
FIG. 10 is a schematic drawing illustrating an ESD protection semiconductor device provided by a sixth preferred embodiment of the present invention.

Please refer to FIG. 10, which is a schematic drawing illustrating an ESD protection semiconductor device provided by a sixth preferred embodiment of the present invention. It should be noted that elements the same in the aforementioned embodiments and the sixth preferred embodiment include the same conductivity type, and thus those details are omitted herein in the interest of brevity. As shown in FIG. 10, an ESD protection semiconductor device 500 provided by the preferred embodiment includes a p-typed substrate 502 having an n-typed deep well region (not shown) formed therein.

Please still refer to FIG. 10. The ESD protection semiconductor device 500 provided by the preferred embodiment includes a gate 510, an isolation structure (not shown) such as a FOX layer and a gate dielectric layer (not shown) formed on the deep well region, and the gate 510 covers a portion of the isolation structure. In this preferred embodiment, the gate 510 also has a stripe layout pattern. In other words, the gate 510 provided by the preferred embodiment is also known as a finger type gate approach. The ESD protection semiconductor device 500 further includes a p-typed body region (not shown) and an n-typed drift region (not shown), which are spaced apart from each other by the gate 510 and the isolation structure. The ESD protection semiconductor device 500 further includes a common drain 520 and a source 530 formed in the deep well region in the substrate 502. More important, the semiconductor device 500 provided by the preferred embodiment includes a pair of p-doped regions 540 formed at respective two ends of the source 530. It is noteworthy that for clarifying the spatial relationships between the gate 510, the common drain 520, the source 530, and the p-doped regions 540, only abovementioned elements are shown in FIG. 10 while other elements such as the body region, the drift region, the deep well region, and the insulating structure are all omitted. However, those skilled in the art would easily realize the placements for the omitted elements according to the aforementioned first preferred embodiment. As shown in FIG. 10, the p-doped regions 540 and the source 530 together are spaced apart from the common drain 520 by the gate 510 and the isolation structure. Furthermore, the pair of p-doped regions 540 can include a pyramid shape as mentioned in the third preferred embodiment.

Additionally, a width W of the ESD protection semiconductor device 500, which is defined as an overall length of the source region 530 and the p-doped regions 540, is between 18-30 μm. And a length L of the ESD protection semiconductor device 500, which is defined as an overall width of the sources 530, the gates 510, and the common drain 520, is between 75-95 μm. For example but not limited to this, the width W of the ESD protection semiconductor device 500 is 19.7 μm while the length L is 75 μm.

Please still refer to FIG. 10. The ESD protection semiconductor device 500 provided by the preferred embodiment further includes a plurality of first contacts 542 formed in the p-doped regions 540, a plurality of second contacts 532 formed in the source 530, and a plurality of third contacts 522 formed in the common drain 520. However, as mentioned above, the amounts of the first contact 542 in each p-doped region 540 can be larger than 1 if required. The first contacts 542 make it accessible to provide a voltage to the body region through the p-doped regions 540. The second contacts 532 are arranged along the direction D in the common source 530 as shown in FIG. 10. It is noteworthy that due to the longitudinal arrangement, the spaces between the first contacts 542 near two ends of the source 530 and the second contacts 532 disposed in the source 530 are gradually increased along a direction toward the center of the source 530. More important, as the spaces between the first contacts 542 and the second contacts 532 are increased, $R_{sub}$ is increased, thereby reducing the trigger voltage of the ESD protection semiconductor device 500.

According to the ESD protection semiconductor device 500 provided by the sixth preferred embodiment, the p-doped regions 540 is provided at two respective ends of the source 530 and thus the spaces between the first contacts 542 which is formed in the p-doped region 540 and the second contacts 532 which are formed in the source 530 are increased and resulted in increased $R_{sub}$. Consequently, the trigger voltage of the ESD protection semiconductor device 500 is reduced without impacting other specification such as the breakdown voltage of the ESD protection semiconductor device 500.

Figure 11:
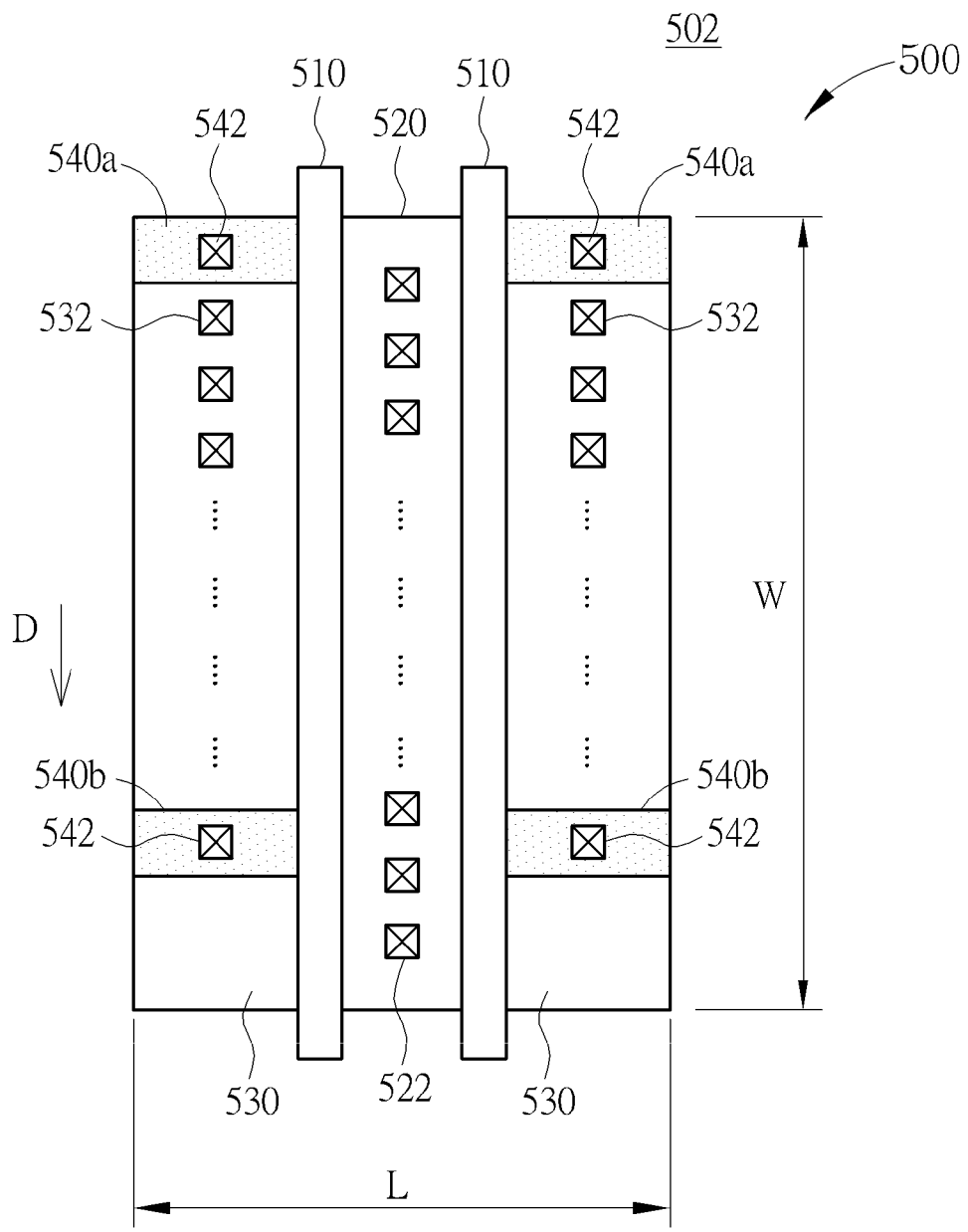
FIG. 11 is a schematic drawing illustrating an ESD protection semiconductor device provided by a modification to the sixth preferred embodiment.

Please refer to FIG. 11, which is a modification to the sixth preferred embodiment of the present invention. It should be noted that elements the same in the sixth embodiment and the modification include the same conductivity type, and thus those details are omitted herein in the interest of brevity. Furthermore, elements the same in the fifth preferred embodiment and the modification are designated by the same numerals. The difference between the sixth preferred embodiment and the modification embodiment is: the pair of p-doped regions 540 are fixed at respective two ends of the source 530 according to the sixth preferred embodiment while only one of the p-doped regions 540a is fixed on one end of the source 530 according to the modification. It should be noted that the other p-doped region 540b is formed to interrupt the source 530 as shown in FIG. 11. In other words, the other p-doped region 540b is not formed at the end of the source 530, but sandwiched in the source 530 in the substrate-horizontal direction as shown in FIG. 11.

Please still refer to FIG. 11. It is also noteworthy that the semiconductor device 500 provided by the modification includes a plurality of first contacts 542 formed in both of the p-doped region 540a/540b.

Figure 12:
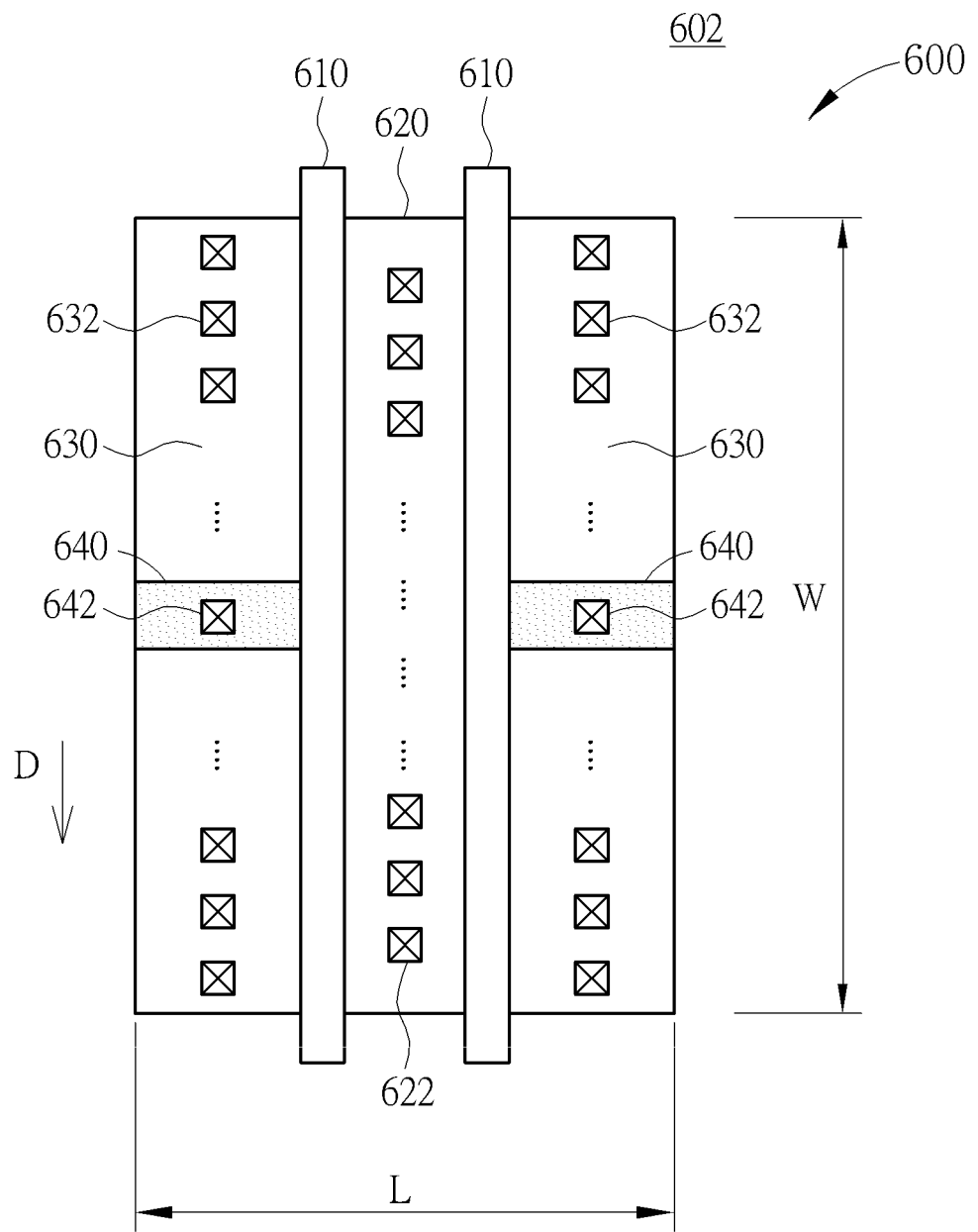
FIG. 12 is a schematic drawing illustrating an ESD protection semiconductor device provided by a seventh preferred embodiment of the present invention.

Please refer to FIG. 12, which is a schematic drawing illustrating an ESD protection semiconductor device provided by a seventh preferred embodiment of the present invention. It should be noted that elements the same in the aforementioned embodiments and the seventh preferred embodiment include the same conductivity type, and thus those details are omitted herein in the interest of brevity. As shown in FIG. 12, an ESD protection semiconductor device 600 provided by the preferred embodiment includes a p-typed substrate 602 having an n-typed deep well region (not shown) formed therein.

Please still refer to FIG. 12. The ESD protection semiconductor device 600 provided by the preferred embodiment includes a gate 610, an isolation structure (not shown) such as a FOX layer and a gate dielectric layer (not shown) formed on the deep well region, and the gate 610 covers a portion of the isolation structure. In this preferred embodiment, the gate 610 also has a stripe layout pattern. In other words, the gate 610 provided by the preferred embodiment is also known as a finger type gate approach. The ESD protection semiconductor device 600 further includes a p-typed body region (not shown) and an n-typed drift region (not shown), which are spaced apart from each other by the gate 610 and the isolation structure. The ESD protection semiconductor device 600 further includes a common drain 620 and a source 630 formed in the deep well region in the substrate 602. More important, the ESD protection semiconductor device 600 provided by the preferred embodiment includes one p-doped region 640 formed to interrupt the source 630. In other words, the p-doped region 640 is formed not at any end of the source 630, but sandwiched by the source 630 in substrate-horizontal direction as shown in FIG. 12. It is noteworthy that for clarifying the spatial relationships between the gate 610, the common drain 620, the source 630, and the p-doped region 640, only abovementioned elements are shown in FIG. 12 while other elements such as the body region, the drift region, the deep well region, and the insulating structure are all omitted. However, those skilled in the art would easily realize the placements for the omitted elements according to the aforementioned first preferred embodiment. As shown in FIG. 12, the p-doped region 640 and the source 630 together are spaced apart from the common drain 610 by the gate 610 and the isolation structure.

Additionally, a width W of the ESD protection semiconductor device 600, which is defined as an overall length of the source region 630 and the p-doped region 640, is between 18-30 μm. And a length L of the ESD protection semiconductor device 600, which is defined as an overall width of the sources 630, the gates 610, and the common drain 620, is between 75-95 μm. For example but not limited to this, the width W of the ESD protection semiconductor device 600 is 19.7 μm while the length L is 75 μm.

Please still refer to FIG. 12. The ESD protection semiconductor device 600 provided by the preferred embodiment further includes a first contact 642, a plurality of second contacts 632, and a plurality of third contacts 622 formed on the substrate 602. However, as mentioned above, the amounts of the first contact 642 can be larger than 1 if required. More specifically, the first contact 642 is electrically connected to the p-doped region 640, the second contacts 632 are electrically connected to the source 630, and the third contacts 622 are electrically connected to the common drain 620. The first contact 642 makes it accessible to provide a voltage to the body region through the p-doped region 640. The second contacts 632 are arranged along the direction D in the common source 630 as shown in FIG. 12. It is noteworthy that due to the longitudinal arrangement, the spaces between the first contacts 642 and the second contacts 632 disposed in the source 630 are gradually increased along a direction toward two respective ends of the source 630. More important, as the spaces between the first contacts 642 and the second contacts 632 are increased, $R_{sub}$ is increased, thereby reducing the trigger voltage of the ESD protection semiconductor device 600.

According to the ESD protection semiconductor devices provided by the present invention, one doped region or a pair of doped regions having the second conductivity complementary to the common source is disposed at one end or two respective ends of the common source. It is found that $R_{sub}$ is conspicuously increased by the doped region(s) and thus the trigger voltage of the semiconductor devices is desirably reduced. Consequently, the ESD protection semiconductor device is quickly turned on for rendering immediate ESD protection to the core circuit. More important, the ESD protection semiconductor devices provided by the present invention can be easily realized in racetrack type or finger type gate approach and thus provides superior product flexibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection semiconductor device comprising:
    a substrate;
    a gate positioned on the substrate, the gate comprising a pair of liner portions and a pair of curved end portions in a top view;
    a drain and a source formed in the substrate at respective two sides of the gate, the drain and the source comprising a first conductivity type; and
    a first doped region formed at one end of the source, the first doped region comprising a second conductivity type complementary to the first conductivity type, and a portion of the first doped region being overlapped with the curved end portion of the gate,
    wherein the source comprises a pair of long sides and a pair of short sides in the top view, and the first doped region is formed at one of the short sides.

2. The ESD protection semiconductor device according to claim 1, wherein the gate comprises a layout pattern of a racetrack shape.

3. The ESD protection semiconductor device according to claim 2, wherein the source is a common source.

4. The ESD protection semiconductor device according to claim 1, further comprising a first contact electrically connected to the first doped region.

5. The ESD protection semiconductor device according to claim 4, further comprising a second doped region comprising the second conductivity type.

6. The ESD protection semiconductor device according to claim 5, wherein the first doped region and the second doped region are formed at respective two ends of the source.

7. The ESD protection semiconductor device according to claim 6, further comprising a second contact electrically connected to the second doped region.

8. The ESD protection semiconductor device according to claim 6, wherein the first doped region and the second doped region respectively comprise a pyramid shape.

9. The ESD protection semiconductor device according to claim 8, wherein the first doped region and the second doped region respectively comprise a first level formed at the end of the common source and a second level formed between a center of the common source and the first level.

10. The ESD protection semiconductor device according to claim 9, further comprises a second contact, the first contact is electrically connected to the second level of the first doped region and the second contact is electrically connected to the second level of the second doped region.

11. The ESD protection semiconductor device according to claim 9, wherein a width of the second level is smaller than a width of the first level.

12. The ESD protection semiconductor device according to claim 1, further comprising a plurality of third contacts electrically connected to the source.

13. An electrostatic discharge (ESD) protection semiconductor device comprising:
- a substrate;
- a gate positioned on the substrate, the gate comprising a pair of liner portions and a pair of curved end portions in a top view;
- a drain and a source formed in the substrate at respective two sides of the gate, the drain and the source comprising a first conductivity type; and
- a doped region formed in the source, the doped region comprising a second conductivity type complementary to the first conductivity type, and a portion of the doped region being overlapped with the curved end portion of the gate,
- wherein the source comprise pair of long sides and a pair of short sides in the top view, the doped region comprises a pair of long sides and a pair of short sides, and the long sides of the doped region are parallel with the short side of the source.

14. The ESD protection semiconductor device according to claim 13, further comprising at least a first contact electrically connected to the doped region.

15. The ESD protection semiconductor device according to claim 13, further comprising a plurality of second contacts electrically connected to the source.

* * * * *